United States Patent
Melcher et al.

(10) Patent No.: US 11,506,623 B2
(45) Date of Patent: Nov. 22, 2022

(54) SYSTEMS FOR DETECTING CRACKS IN WINDOWS

(71) Applicant: Apple Inc., Cupertino, CA (US)

(72) Inventors: Martin Melcher, Mountain View, CA (US); Christopher D. Jones, Los Gatos, CA (US); James R. Wilson, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 198 days.

(21) Appl. No.: 16/985,088

(22) Filed: Aug. 4, 2020

(65) Prior Publication Data

US 2020/0363362 A1 Nov. 19, 2020

Related U.S. Application Data

(63) Continuation of application No. 15/650,709, filed on Jul. 14, 2017, now Pat. No. 10,739,292.

(60) Provisional application No. 62/378,818, filed on Aug. 24, 2016.

(51) Int. Cl.
| | |
|---|---|
| H05B 3/84 | (2006.01) |
| H05B 3/86 | (2006.01) |
| H05B 3/20 | (2006.01) |
| H05B 3/28 | (2006.01) |
| G01N 27/20 | (2006.01) |
| H05B 3/12 | (2006.01) |
| H05B 3/18 | (2006.01) |
| B32B 17/10 | (2006.01) |
| G01R 27/02 | (2006.01) |

(52) U.S. Cl.
CPC ....... *G01N 27/20* (2013.01); *B32B 17/10036* (2013.01); *H05B 3/12* (2013.01); *H05B 3/18* (2013.01); *H05B 3/86* (2013.01); *G01R 27/02* (2013.01); *H05B 2203/031* (2013.01)

(58) Field of Classification Search
CPC .......... H05B 3/84–86; H05B 2203/031; H05B 3/10–14; H05B 3/20–34
See application file for complete search history.

(56) References Cited

U.S. PATENT DOCUMENTS

| | | |
|---|---|---|
| 4,565,919 A | 1/1986 | Bitter et al. |
| 4,808,799 A | 2/1989 | Schave |
| 4,829,163 A * | 5/1989 | Rausch .................... H02H 5/10 219/547 |
| 4,939,348 A | 7/1990 | Criss |

(Continued)

*Primary Examiner* — Michael A Laflame, Jr.
(74) *Attorney, Agent, or Firm* — Treyz Law Group, P.C.; G. Victor Treyz; Kendall P. Woodruff

(57) ABSTRACT

A system such as a vehicle may have windows with one or more conductive layers. The conductive layers may form part of an infrared-light-blocking layer or other layer. The infrared-light-blocking layer or other layer may be formed as a coating on a transparent structural window layer such as an outer or inner glass layer in a laminated window or may be embedded in a polymer layer between the outer and inner layers. Segmented terminals and elongated terminals that may extend past two or more segmented terminals may be coupled to the edges of the conductive layers. Using these terminals, control circuitry can apply localized ohmic heating currents and can make resistance measurements on the conductive layers to detect cracks.

19 Claims, 9 Drawing Sheets

(56) References Cited

U.S. PATENT DOCUMENTS

| | | | |
|---|---|---|---|
| 5,543,601 A * | 8/1996 | Bartrug | B32B 17/10174 |
| | | | 338/322 |
| 8,383,994 B2 * | 2/2013 | Rashid | B32B 17/10174 |
| | | | 219/203 |
| 2001/0003336 A1 | 6/2001 | Abbott et al. | |
| 2004/0021453 A1 * | 2/2004 | Jessup | B60R 25/1004 |
| | | | 324/525 |
| 2009/0044897 A1 | 2/2009 | Thomsen et al. | |
| 2010/0163675 A1 | 7/2010 | Rashid et al. | |
| 2011/0017487 A1 | 1/2011 | Short | |
| 2015/0171624 A1 | 6/2015 | Duarte et al. | |

* cited by examiner

SYSTEMS FOR DETECTING CRACKS IN WINDOWS

This application is a continuation of U.S. patent application Ser. No. 15/650,709, filed on Jul. 14, 2017, which claims priority to U.S. provisional patent application No. 62/378,818, filed on Aug. 24, 2016, both of which are hereby referenced herein in their entireties.

FIELD

This relates generally to systems with windows, and, more particularly, to systems such as vehicles having windows.

BACKGROUND

Vehicle windows sometimes include thin films through which ohmic heating current may be applied to defrost the windows. Impact from road debris and other objects can damage windows. For example, a thin film layer in a window that is used for heating the window may become damaged. When this damage is left undetected, there is a risk that the thin film will corrode due to exposure to moisture or that the thin film may not perform properly. Windows that develop small cracks may also be prone to more extensive cracking.

SUMMARY

A system such as a vehicle may have windows. Control circuitry in the vehicle may make resistance measurements on the windows to detect cracks. The control circuitry may also apply ohmic heating currents to the windows to heat the windows. The windows may include conductive layers that are used in making resistance measurements and that are used in ohmic heating. These conductive layers may form part of an infrared-light blocking layer or other window layer.

An infrared-light-blocking layer or other layer in a window may be formed as a coating on a transparent structural window layer such as an outer or inner window layer in a laminated window or may be embedded in a polymer layer between the outer and inner layers.

Terminals formed from elongated strips of metal may be coupled to the edges of one or more of the conductive layers in the window. The terminals may include segmented terminals and terminals that extend across the entire width or height of the window. Elongated terminals may extend past multiple segmented terminals. Using these terminals, the control circuitry can apply localized ohmic heating currents and can make resistance measurements on the conductive layers to detect cracks.

DETAILED DESCRIPTION

A system may have windows with one or more structural layers such as layers of glass or rigid plastic. For example, a window may have an outer structural layer such as an outer glass or plastic layer that is laminated to an inner structural layer such as an inner layer of glass or plastic using a layer of polymer. To provide the windows with desired optical properties, additional structures may be incorporated into the windows. These additional structures may include dielectric thin films, conductive layers such as thin-film metal layers, layers that form filters for blocking infrared, visible and/or ultraviolet light, ink layers and other layers for adjusting the outward appearance of part or all of a window, and/or other structures.

It may be desirable to ohmically heat a window to deice and/or defrost the window. To facilitate ohmic heating, at least one of the layers in a window may be formed from a conductive material. Current may be applied to a conductive layer to ohmically heat the conductive layer and thereby defrost and/or deice the window.

A window may develop cracks due to impacts from roadway debris or other objects. The conductive layer in a window that is used for ohmic heating or other conductive layer in a window may be monitored by control circuitry in a vehicle. Control circuitry may, for example, apply a known voltage to a conductive layer while measuring a resulting current. Using measurements such as these, information on the resistance of the conductive layer and/or other electrical properties (capacitance, inductance, etc.) can be gathered. Resistance measurements (or other measurements) that are abnormal (e.g., excessively high resistance values) are indicative of a crack in the window, so suitable corrective actions may be taken.

Figure 1:
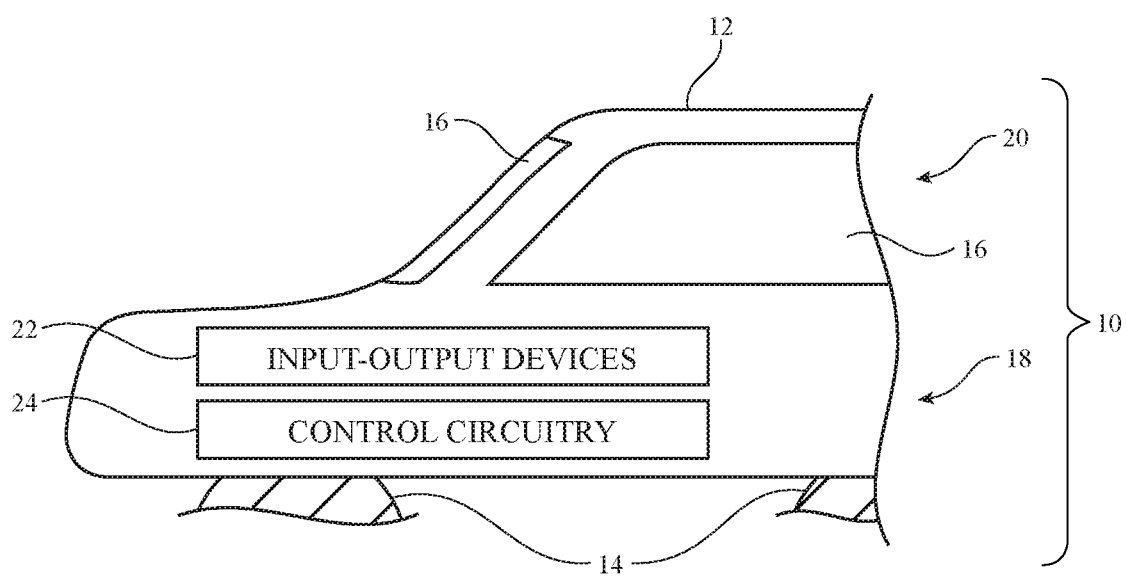
FIG. 1 is a schematic diagram of an illustrative system in accordance with an embodiment.

An illustrative system with windows is shown in FIG. 1. As shown in FIG. 1, system 10 may be a vehicle having portions such as portions 18 and 20. Portion 18 may include wheels 14, a body such as body 12 with a chassis to which wheels 14 are mounted, propulsion and steering systems, and other vehicle systems. These systems may be controlled manually by a driver (user) in vehicle 10 or may be autonomous. For example, vehicle 10 may have control circuitry that gathers driving data dynamically using light-based sensors, ranging systems based on light and/or radio-frequency signals, circuitry for handling wireless data, and/or circuitry that gathers other sensor data and wireless data. The control circuitry may use an electrically controllable steering system in vehicle 10 to automatically drive vehicle 10.

Body 12 may include doors, trunk structures, a hood, side body panels, a roof, and/or other body structures. Seats may be formed in the interior of vehicle 10. Portion 20 may include windows such as window(s) 16 mounted to body 12. Window 16 and portions of body 12 may separate the interior of vehicle 10 from the exterior environment that is surrounding vehicle 10.

Windows 16 may include front windows on the front of vehicle 10, a moon roof (sunroof) window or other window extending over some or all of the top of vehicle 10, rear windows on the rear of vehicle 10, and side windows on the sides of vehicle 10. Windows 16 may be formed from one or more layers of transparent glass, clear rigid polymer (e.g., polycarbonate), polymer adhesive layers, and/or other layers. In some arrangements, window(s) 16 may include laminated window structures such as two or more transparent layers (glass, rigid polymer, etc.) with interposed polymer layer(s). The polymer in a laminated window may be, for example, a polymer such as polyvinyl butyral (PVB) or ethylene-vinyl acetate (EVA).

Vehicle 10 may include control circuitry 24 and input-output devices 22. Control circuitry 24 may include storage and processing circuitry for supporting the operation of vehicle 10 (e.g., to support manual and/or automated driving, to take other actions based on user input, to take other actions autonomously, etc.). The storage and processing circuitry may include storage such as hard disk drive storage, nonvolatile memory (e.g., electrically-programmable-read-only memory configured to form a solid state drive), volatile memory (e.g., static or dynamic random-access-memory), etc. Control circuitry 24 may also include processing circuitry based on one or more microprocessors, microcontrollers, digital signal processors, baseband processors, power management units, audio chips, application specific integrated circuits, etc.

Processing circuitry in control circuitry 24 may be used to control the operation of vehicle 10 and the components in vehicle 10 (e.g., components associated with windows 16 and input-output components 22, etc.). For example, control circuitry 24 can apply signals (ohmic heating currents) to conductive films in windows 16 to ohmically heat windows 16 or portions of windows 16. Control circuitry can also measure the resistance of a conductive window layer to identify window cracks.

Input-output devices 22 may be used to gather data for vehicle 10, may be used to gather information from a user (vehicle occupant, etc.) of vehicle 10, may be used to provide data from vehicle 10 to external systems or a user, and/or may be used in handling other input and output operations. Input-output devices 22 may include buttons, scrolling wheels, touch pads, key pads, keyboards, and other user input devices. Microphones may be used to gather voice input from a user and may gather information on ambient sounds. Devices 22 may include ambient light sensors, proximity sensors, magnetic sensors, force sensors, accelerometers, image sensors, and/or other sensors for gathering input. Output may be supplied by devices 22 using audio speakers, tone generators, vibrators, haptic devices, displays, light-emitting diodes and other light sources, and other output components. Vehicle 10 (e.g., devices 22, etc.) may include wired and wireless communications circuitry that allows vehicle 10 (e.g., control circuitry 24) to communicate with external equipment and that allows signals to be conveyed between components (circuitry) at different locations in vehicle 10.

Light filter layers and other layers may be incorporated into window 16. As an example, an infrared-light-blocking layer may extend over some or all of a window. The infrared-light-blocking layer may be formed from one or more layers of silver or other metal and/or may include thin-film interference filters formed from multiple dielectric layers and/or other layers). These layers may be formed from thin-film coatings deposited using physical vapor deposition or other thin-film deposition techniques, may be applied as a polymer coating (e.g., by spraying, printing, etc.), may be formed by laminating a flexible polymer film that includes these layers to window 16, or may be formed using other suitable fabrication techniques.

Inclusion of light filter layers and other layers into window 16 may alter the visible light and infrared light transmission of window 16. As one example, an infrared-light-blocking layer may block 50% or more, 70% or more, or 90% or more of near infrared light (e.g., light with wavelengths from 700-2500 nm, light from 700-1000 nm, other light with wavelengths more than 700 nm or less than 2500 nm, etc.) and may allow 100%, 70% or more, 90% or more, or less than 99% of visible light to pass.

Infrared light blocking may be desirable to prevent excessive heat buildup in the interiors of vehicles exposed to sunlight. Visible light blocking may be used to cut down on transmitted light levels (e.g., to reduce excessive bright light to more desirable brightness levels).

To ohmically heat window 16, control circuitry 24 may pass ohmic heating current through one or more conductive thin-film layers in window 16. The ohmic heating current will cause the conductive thin-film layers to ohmically heat window 16. If desired, one or more of the conductive thin-film layers to which ohmic heating current is applied may be conductive thin-film layers associated with a functional layer in window 16 (e.g., an infrared-light-blocking layer, etc.). To monitor for cracks in window 16, control circuitry 24 may measure the resistance of a thin-film layer in window 16. The thin-film layer that is monitored in this way may be a conductive thin-film layer associated with an infrared-light blocking layer, may be an ohmically heated layer, may be a layer that is not ohmically heated, or may be any other suitable layer.

Figure 2:
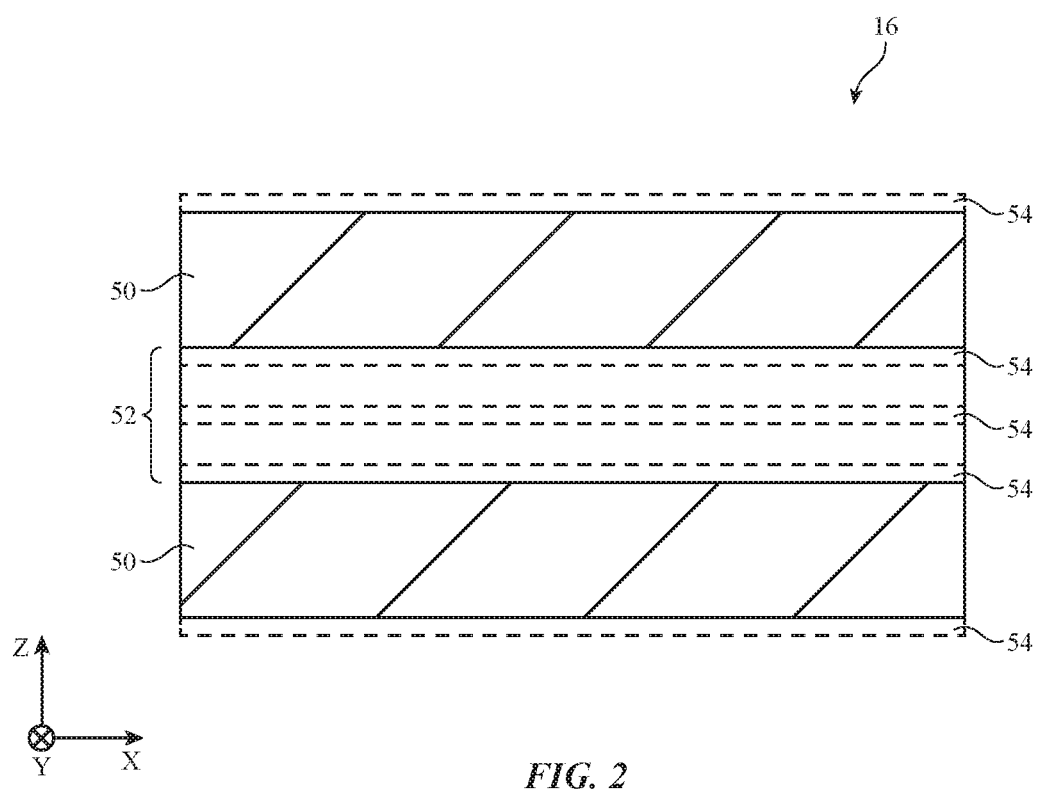
FIG. 2 is a cross-sectional side view of a portion of a window in accordance with an embodiment.

A cross-sectional side view of an illustrative window is shown in FIG. 2. As shown in FIG. 2, window 16 may include one or more transparent structural layers such as structural window layers 50. Two layers 50 are included in window 16 in the example of FIG. 2, but more than two layers or fewer than two layers may be included in window 16, if desired. Layers 50 may be clear layers of rigid polymer, glass, or other transparent material. Polymer layer 52 (e.g., a PVB layer, an EVA layer, or other polymer layer) may be used to couple layers 50 together and/or layers such as layers 50 may be separated by an air gap. Illustrative configurations in which layers 50 are coupled by polymer layer 52 may sometimes be described herein as an example.

One or more layers such as layer 54 may be included in window 16. These layers may include diffuser layers (e.g., a translucent sheet of polymer, a textured polymer layer coated with a thin transparent metal layer, etc.), a light filter (e.g., one or more metal layers such as one or more silver layers on one or more inorganic or organic dielectric layers, a filter formed from a multilayer dielectric stack having layers with different refractive index values or other multilayer filter structure that is used to block infrared light, ultraviolet light, and/or visible light, etc.), a tint layer (e.g., an optical absorption layer that has a gray color or other suitable color), and/or other layers (e.g., adjustable layers, etc.). One or more of layers 54 may be incorporated into window 16 (e.g., on the inner and/or outer surface of an inner structural layer 50 or on the inner and/or outer surface of an outer structural layer 50), and/or embedded within polymer layer 52 (e.g., as a thin metal film, as one or more thin-film coating layers on a polymer film carrier or other substrate layer, etc.).

Figure 3:
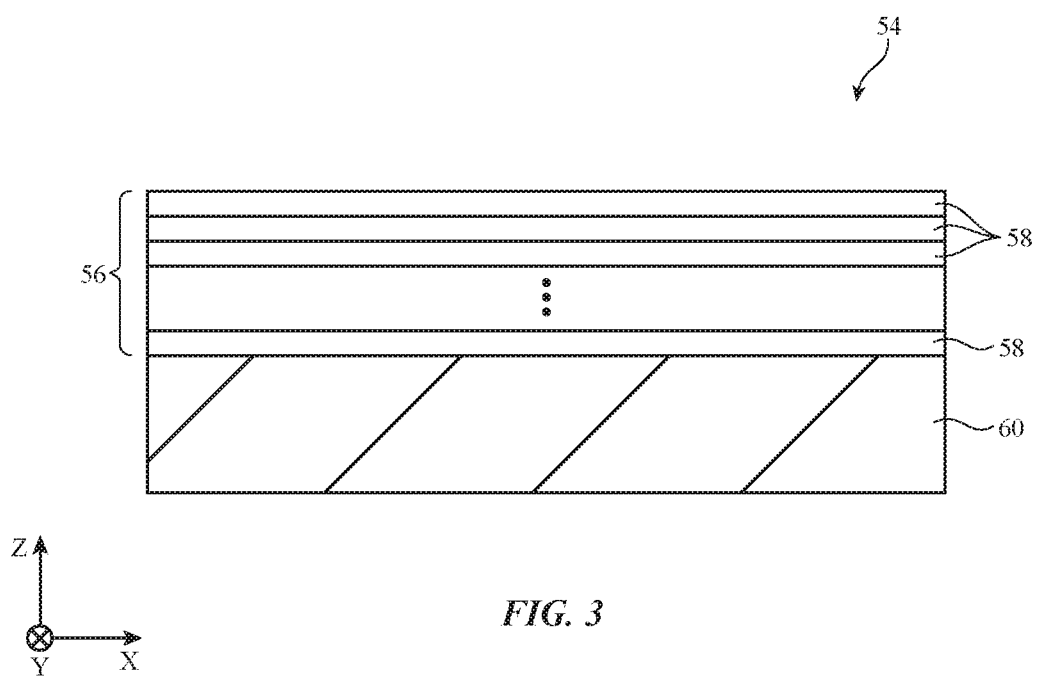
FIG. 3 is a cross-sectional side view of an illustrative layer such as an infrared-light-blocking layer or other layer with one or more conductive layers that may be incorporated into a window in accordance with an embodiment.

A cross-sectional side view of an illustrative layer 54 that may be used in some or all areas of window 16 is shown in FIG. 3. As shown in FIG. 3, layer 54 may, if desired, include a thin-film stack such as thin-film stack 56. Stack 56 may include multiple thin-film layers 58. There may be, for example, 3-10 layers 58 in stack 56, more than 4 layers 58, fewer than 10 layers 58, or other suitable number of layers. Layers 58 may include metal layers (e.g., layers of silver, gold, copper, aluminum, titanium, etc.), dielectric layers (e.g., inorganic layers such as oxide layers, polymer layers, etc.), semiconductor layers, transparent conductive layers (e.g., a wide bandgap semiconductor such as indium tin oxide or other transparent conductive oxides), and/or other layers of material. Stack 56 may be formed directly on structural layers such as layers 50 of FIG. 2 and/or may be supported by a polymer carrier film or other supporting substrate that is separate from layers 50 such as optional substrate 60. Substrate 60 may be a polyethylene terephthalate (PET) layer or other polymer carrier layer, may include two or more polymer layers, and/or may be formed from one or more layers of other materials. In configurations in which stack 56 is formed on one or both sides of an optional substrate such as substrate 60, layer 54 may be attached to one of layers 50 (e.g., using adhesive and/or heat and pressure) and/or may be embedded in polymer layer 52 (FIG. 2).

If desired, layers 58 or some of layers 58 may be configured to serve as an infrared-light-blocking layer (filter). For example, layers 58 may contain one or more layers of silver, two silver layers, more than two silver layers, three silver layers, or more than three silver layers. If desired, some or all of these silver layers may be replaced by other metal layers (e.g., gold, copper, aluminum, titanium, etc.). The silver layer or other metal layers may be separated by other layers such as inorganic dielectric layers, semiconductor layers, polymer layers, and/or other layers. With configurations such as these, layers 58 (e.g., the silver layers and/or other metal layers) may serve to block infrared light (e.g., 80% or more of near infrared light from 700-2500 nm, 90% of near infrared light from 700-2500 nm, less than 99% of near infrared light from 700-2500 nm, etc.) and may either be transparent to visible light or may reduce visible light transmission (e.g., visible light transmission may be 70% to 100%, may be 70% to 90%, may be 50-85%, may be less than 90%, may be more than 50%, may be more than 70%, etc.).

In some configurations, some or all of layers 58 (e.g., dielectric layers formed from metal oxides, silicon oxide, silicon nitride, and/or other materials) may form thin-film interference filters. In this type of arrangement, layers 58 or some of layers 58 may form a thin-film stack with dielectric layers that alternate between higher and lower refractive index values, a thin-film stack with layers of higher and lower refractive index values and interposed layers with intermediate refractive index values, and/or a thin-film stack with other patterns of layers that form a thin-film interference filter. The interference filter may be configured to adjust the appearance of window 16, to form a stop-band at near infrared wavelengths (e.g., from 700-2500 nm), to produce a desired amount of visible light attenuation or to be transparent at visible wavelengths, to block ultraviolet light wavelengths, and/or to produce other desired optical properties (transmission, reflection, and absorption) as a function of wavelength.

One or more conductive layers in layer 54 (e.g., one or more silver layers or other metal layers) may be used to carry current through window 16. When it is desired to monitor window 16 for cracks, the amount of current that flows for a given applied voltage (or the voltage that is produced for a given applied current) can be monitored by control circuitry 24 to determine whether the resistance of the conductive layer is abnormally high. When it is desired to heat some or all of window 16, ohmic heating current may be applied to the conductive layer(s) by control circuitry 24. The ohmic heating current will ohmically heat the conductive layer(s) and thereby heat window 16 to defrost and/or deice window 16. The layer or layers to which signals are applied to measure resistance may be the same as the layer or layers to which the ohmic heating current is applied or the layer or layers to which resistance measurement signals are applied may be partly or completely different than the layer or layers to which the ohmic heating signals are applied. Resistance measurements may be made during heating or at other times. Resistance measurement operations may be performed independently of heating operations or resistance measurements may be made on a conductive layer to which ohmic heating current is being applied (e.g., by measuring voltages resulting across the layer in response to application of the ohmic heating current).

Figure 4:
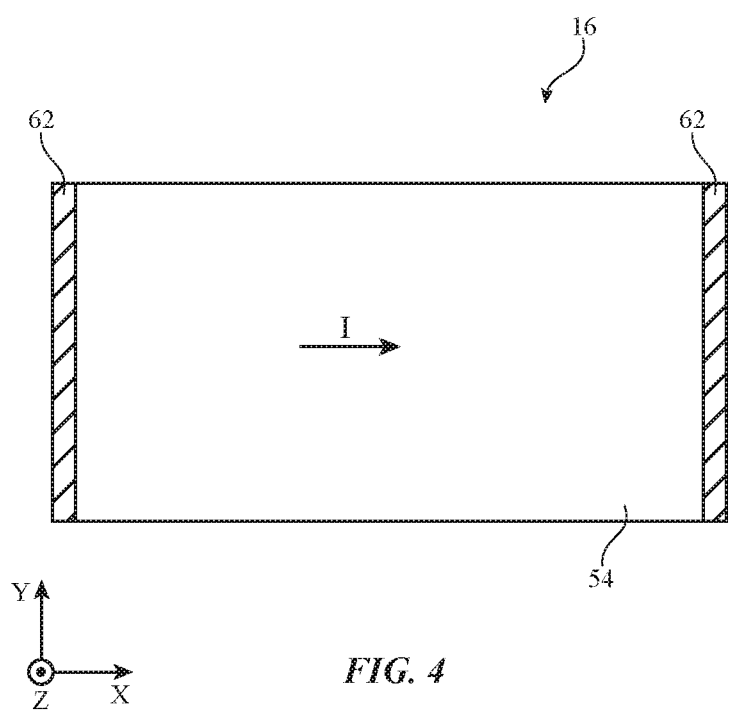
FIG. 4 is a diagram showing how a window may be provided with elongated strips of metal that form terminals through which current may be applied to a conductive thin-film layer to heat the window in accordance with an embodiment.

FIG. 4 is a diagram showing how one or more conductive layers in layer 54 of window 16 may be provided with terminals 62 through which signals may be applied by control circuitry 24. Terminals 62, which may sometimes be referred to as busbars or contacts, may be shorted to one or more conductive layers in layer 54 such as one or more silver layers in an infrared-light-blocking filter, one or more other metal layers in an infrared-light-blocking filter, one or more transparent conductive layers (e.g., one or more layers of indium tin oxide or other transparent conductive oxide), or other conductive layers (metal, transparent conductive material, etc.).

Terminals 62 may have elongated shapes as shown in the FIG. 4 example (e.g., terminals 62 may be formed from strips of metal that run along the edges of window 16, etc.) or may have other suitable shapes. The sheet resistance of the metal or other conductive material in terminals 62 may be less than the sheet resistance of conductive layer to which terminals 62 connect. The lower sheet resistance of the conductive material of terminals 62 helps spread current along the edges of layer 54 before the current I is routed through layer 54 between respective terminals 62. In the example of FIG. 4, current I is flowing horizontally (along dimension X, which may be parallel to the ground). If desired, current I may flow vertically or may follow other paths.

Figure 5:
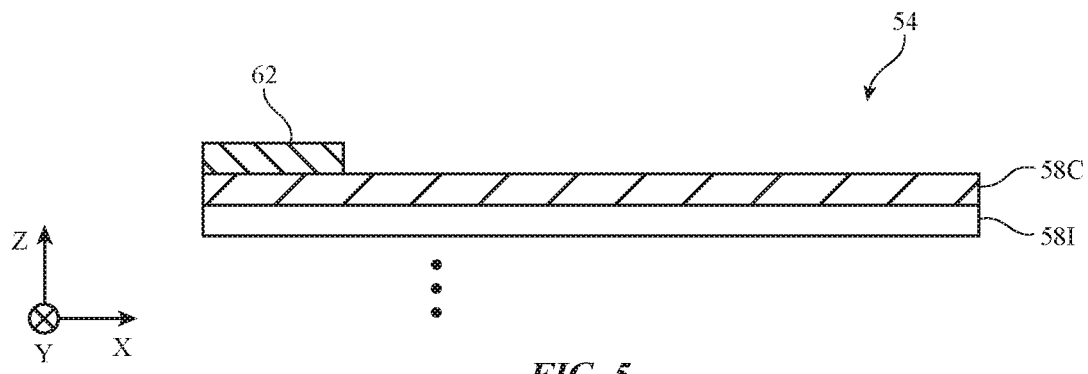
FIG. 5 is a cross-sectional side view of an illustrative window structure having a conductive layer and an elongated terminal in accordance with an embodiment.

FIG. 5 is a cross-sectional side view of layer 54 in an illustrative configuration in which layer 54 includes at least one conductive layer 58C and one additional layer 58I (e.g., a dielectric layer). As shown in FIG. 5, terminal 62 (e.g., an elongated terminal that extends into the page, parallel to the Y axis) may form an ohmic contact with the edge of conductive layer 58C. Layers 58C and 58I may be two layers among multiple layers 58 in stack 56 (FIG. 3).

Figure 6:
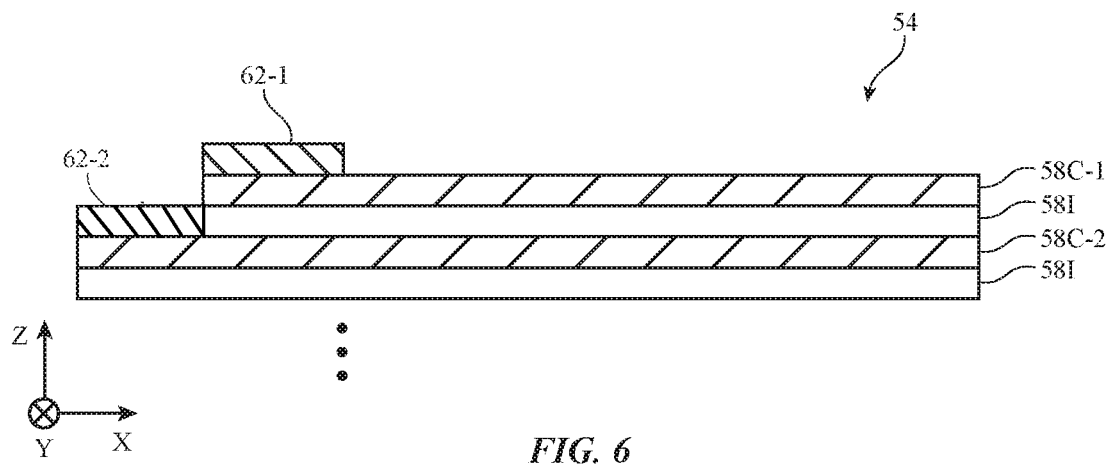
FIG. 6 is a cross-sectional side view of an illustrative window structure having multiple conductive layers each of which is contacted by a respective elongated terminal in accordance with an embodiment.

If desired, terminals may be electrically coupled to multiple conductive layers in layer 54. As shown in FIG. 6, for example, layer 54 may have multiple conductive layers such as conductive layers 58C-1 and 58C-2 and may have multiple additional layers such as layers 58I (e.g., dielectric layers). Terminals such as terminal 62-1 may be electrically coupled to conductive layer 58C-1 and terminals such as terminal 62-2 may be electrically coupled to conductive layer 58C-2. Layers 58C-1 and 58C-2 may be shorted to each other (e.g., by electrically coupling terminals 62-1 and 62-2) or may be electrically isolated from each other. Crack-detection resistance measurements may be made on layer 58C-1 and/or layer 58C-2 and, if desired, ohmic heating current may be applied to layer 58C-1 and/or layer 58C-2. With one illustrative configuration, resistance measurement circuitry in control circuitry 24 may be used to monitor one of layers 58C-1 and 58C-2 for abnormally high resistance levels of the type that are indicative of a crack in window 16 and driver circuitry in control circuitry 24 may be used to apply an ohmic heating current to the other of layers 58C-1 and 58C-2. If desired, the resistance of both of layers 58C-1 and 58C-2 (and, if desired, the resistance of additional conductive layer(s) in layer 54) may be monitored. Each conductive layer in layer 54 (e.g. one layer, two layers, three layers, etc.) may be provided with a different respective pair of terminals 62 and/or two or more conductive layers in layer 54 may be shorted together at the edges of layer 54 by shorting their terminals together. In some arrangements, a conductive layer in layer 54 may be formed from multiple conductive sublayers (e.g., metal layers, conductive oxide layers, etc.) that are stacked directly on top of each other.

Figure 7:
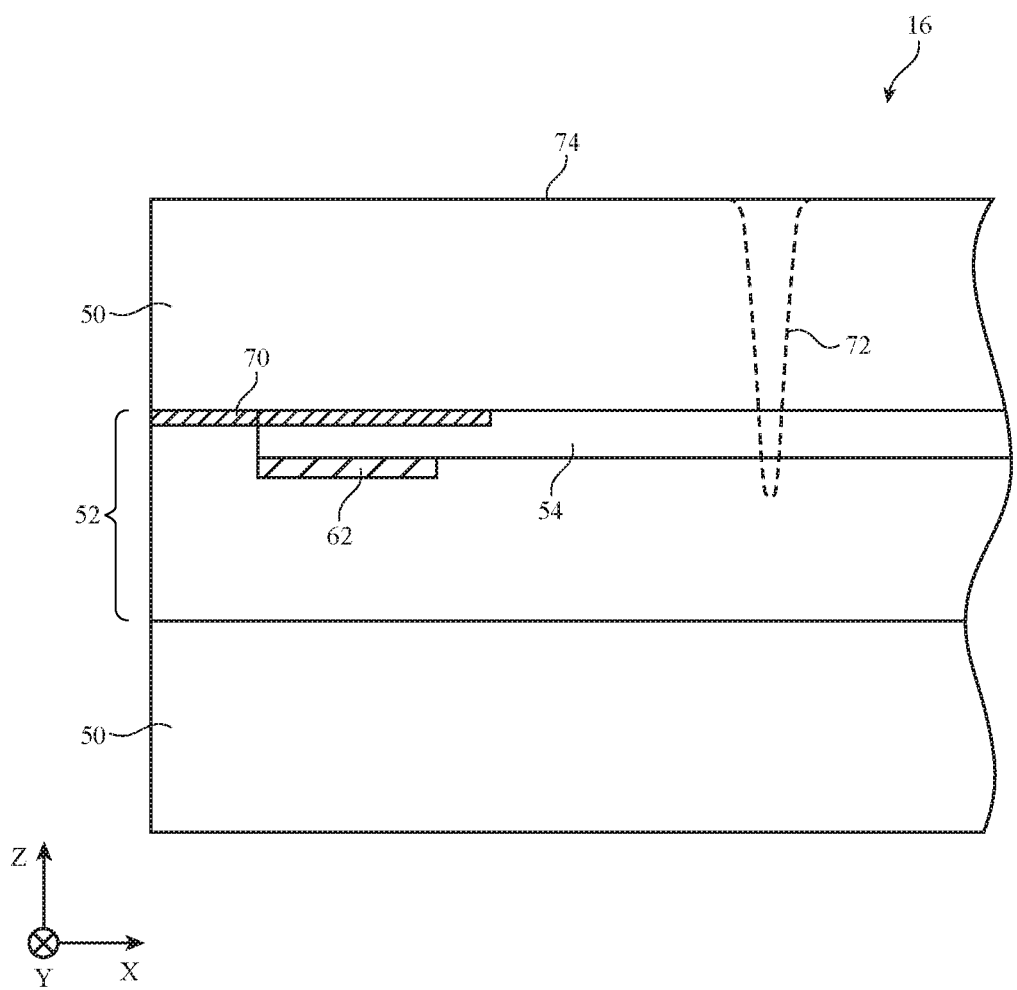
FIG. 7 is a cross-sectional side view of an illustrative window showing how a crack may develop that affects an electrical property of the window in accordance with an embodiment.

A cross-sectional side view of an illustrative edge portion of window 16 is shown in FIG. 7. In the example of FIG. 7, window 16 has outer and inner structural window layers 50 and has a polymer layer (e.g., a PVB or EVA layer, etc.) such as layer 52 that is interposed between layers 50 to couple layers 50 together. Terminals such as terminal 62 may be coupled to one or more conductive layers in layer 54. Layer 54 may be formed from a single layer (e.g., a single silver thin-film layer or a single layer of another metal) and/or may be formed from multiple layers of material as described in connection with FIG. 3. Opaque masking layer 70 may form an opaque border around some or all of the peripheral edges of layer 16. Layer 70 may be formed from a ceramic frit containing pigments such as black particles to render layer 70 opaque, a polymer that contains pigments or dyes (e.g., a polymer that contains black particles to render layer 70 opaque), and/or may contain a thin-film interference filter stack formed from multiple thin-film coatings. The presence of masking layer 70 in the border of window 16 may help to enhance the appearance of window 16 in vehicle 10 (e.g., by hiding terminals such as terminal 62 and/or other structures below the outermost layer of window 16 from view).

During use of vehicle 10, road debris or other external objects may strike exterior surface 74 of the outer structural window layer 50, thereby creating cracks such as crack 72. Crack 72 may extend into the conductive layer or layers in layer 54. When crack 72 is present in a given conductive layer, an open circuit is formed in the conductive layer at the crack location. As a result, current flow across the crack location will be impeded and the resistance of that layer will increase. The increase in resistance of the cracked conductive layer can be detected by control circuitry 24 and appropriate action taken.

Figure 8:
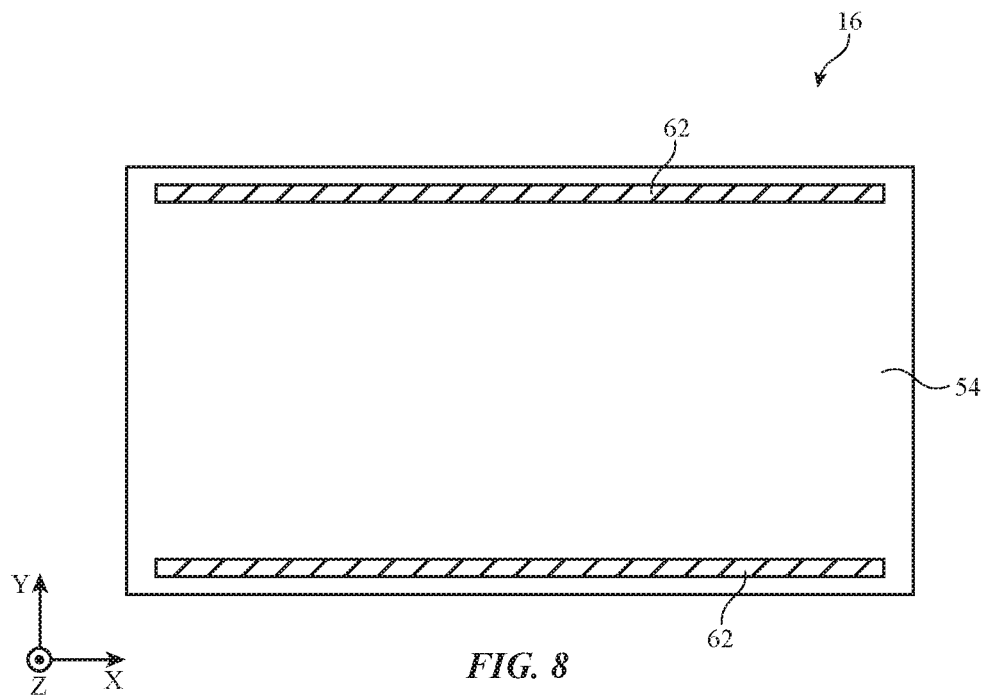
FIG. 8 is a diagram of an illustrative window showing how elongated terminals may extend across the upper and lower edges of the window in accordance with an embodiment.
Figure 9:
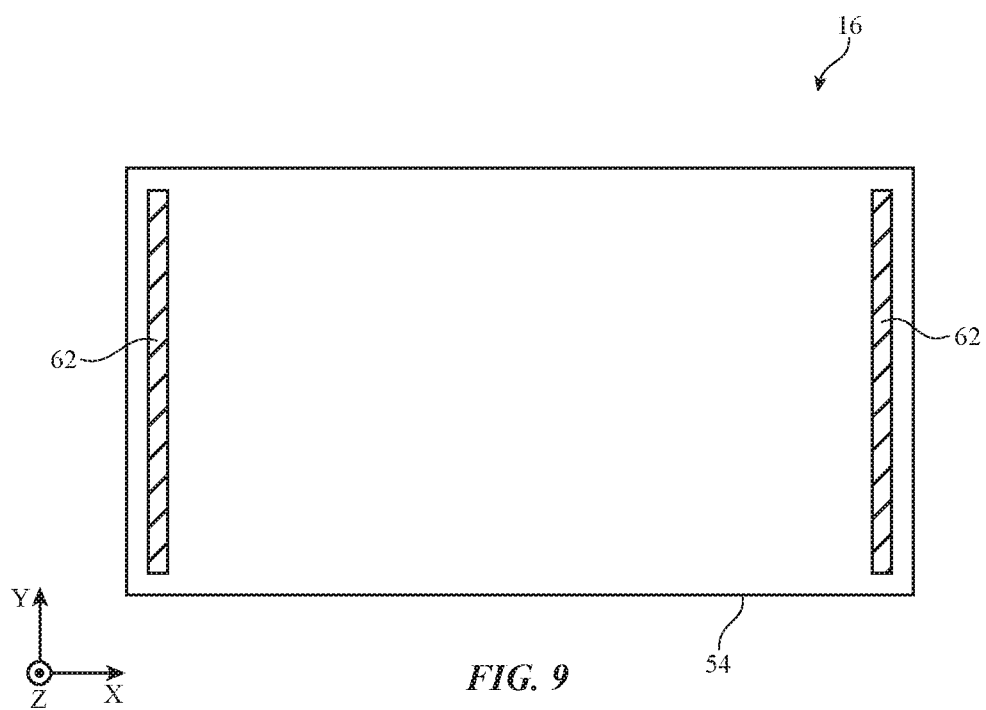
FIG. 9 is a diagram of an illustrative window showing how elongated terminals may extend along the left and right edges of the window in accordance with an embodiment.

If desired, terminals (busbars) 62 may extend horizontally along the top and bottom edges of window 16 (parallel to dimension X), as shown in the example of FIG. 8. FIG. 9 shows how terminals 62 may extend vertically along the left and right edges of window 16 (as an example). Other configurations may be used, if desired. For example, terminals 62 may be provided within interior portions of the footprint of window 16, may have curved shapes, may have non-elongated shapes, etc.

Figure 10:
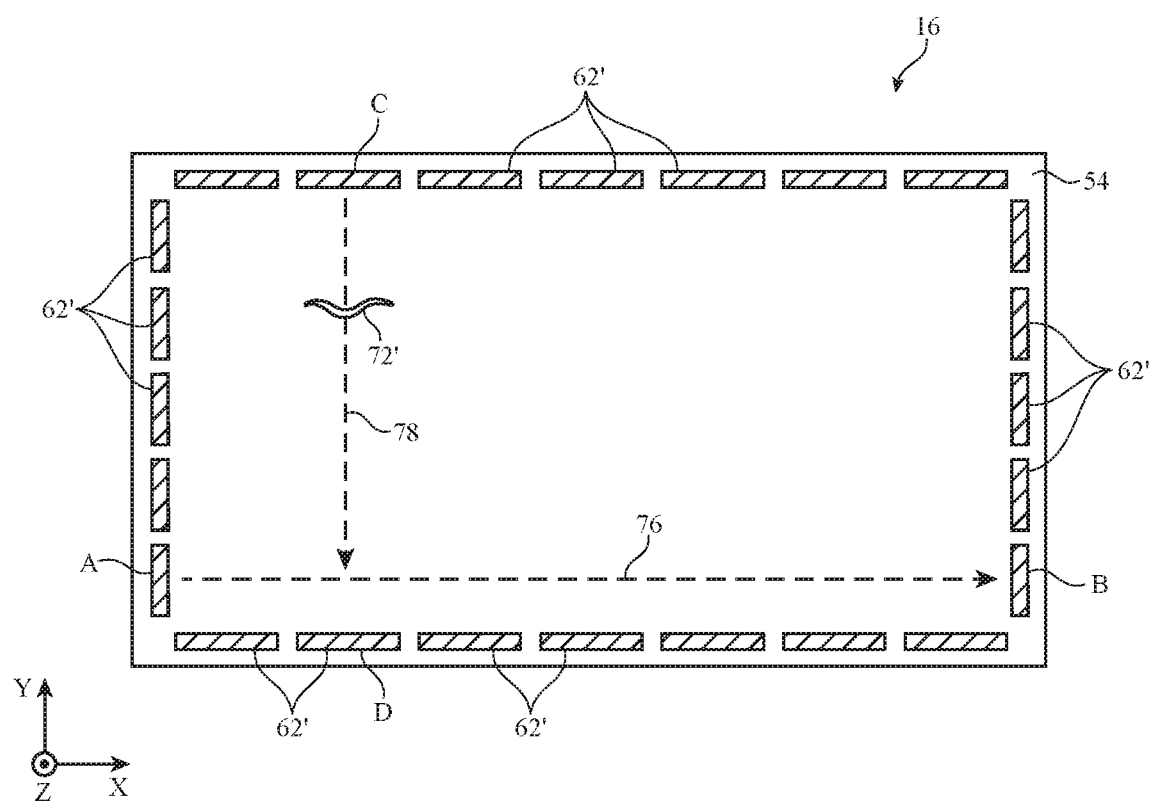
FIG. 10 is a diagram showing how horizontally extending and vertically extending elongated terminals may be segmented in accordance with an embodiment.

FIG. 10 shows how segmented terminal configurations may be used in window 16. In the example of FIG. 10, segmented terminals 62' (e.g., strips of metal or other elongated conductive structures that are shorter than the full-length terminals of FIGS. 8 and 9) may be provided along one or more of the edges of window 16. Each terminal 62' may contact a conductive layer in layer 54 at a different respective location.

By providing multiple segmented terminals along the edges of layer 54, control circuitry 24 may ohmically heat different corresponding regions of window 16 and/or may make targeted resistance measurements. Crack detection may be facilitated by making resistance measurements that are perpendicular to the direction of crack propagation. As a result, it may be desirable to make crack-detection resistance measurements along both vertical and horizontal directions. A vehicle window may have particular areas that are more prone to icing or condensation than others and/or may have areas (e.g. a driver-side window area) that are of interest to defrost and deice before others. By segmenting terminals 62', crack detection accuracy may be enhanced and ohmic heating operations may be provided with enhanced flexibility.

As an example, consider a scenario in which it is desired to defrost an area running along the lower edge of window 16. In this scenario, an ohmic heating current can be applied along path 76 between terminals A and B to ohmically heat the portion of window 16 that lies directly between terminals A and B.

As another example, consider a scenario in which window 16 has a crack such as crack 72' that lies parallel to horizontal dimension X. This type of horizontal crack may be detected effectively by measuring the resistance between terminals C and D along vertical path 78 parallel to orthogonal dimension Y (as an example).

In general, window 16 may have terminals of any suitable layout (elongated terminals that extend across most or all of the width and/or height of window 16, segmented terminals along the vertical and/or horizontal edges of window 16, and/or combinations of these layouts). Each terminal may be coupled to the same conductive layer in layer 54 or one or more of the terminals may be coupled to different conductive layers in layer 54. For example, one conductive layer may have terminals such as segmented terminals 62' of FIG. 10 and another conductive layer may have terminals 62 of FIG. 8 that each extend across the entire width of window 16 and that therefore each extend past multiple segmented terminals 62'. Configurations in which each of two conductive layers each has a respective set of segmented terminals or in which each of two conductive layers each have terminals 62 of FIG. 8 and/or FIG. 9 may also be used. Terminals 62 of FIG. 8 may be coupled to one conductive layer and terminals 62 of FIG. 9 may be coupled to the same conductive layer or another conductive layer. In general, any suitable combination of horizontal and/or vertical elongated terminals 62 and/or segmented terminals 62' may be used.

With multiple terminals, control circuitry 24 has flexibility in making resistance measurements. For example, control circuitry 24 can cycle through different horizontal pairs and/or vertical pairs of segmented terminals 62' during resistance measurement operations to help detect and localize cracks 72'. Resistance measurements may also be made through one conductive layer using a first set of terminals at the same time that ohmic heating current is being independently applied through a separate conductive layer using a second set of terminals. If desired, resistance may be measured by monitoring the voltage rise that accompanies applied ohmic heating current (e.g., so that both resistance measurement operations and ohmic heating operations can be performed simultaneously using the same set of terminals). Resistance measurements may be made periodically (e.g., once per minute) using low power signals to provide vehicle 10 with continuous crack detection capabilities. Resistance measurements may also be made just before each ohmic heating operation is commenced to ensure that the ohmic heating conductive layer has not been compromised. Ohmic heating operations may be performed automatically (e.g., when condensation is detected using a moisture sensor, camera, or other detection equipment, based on exterior and/or interior temperature information, based on weather forecasts that have been wirelessly received by control circuitry 24, etc.) and/or may be performed manually (e.g., in response to a button press or other input from a user of vehicle 10).

Figure 11:
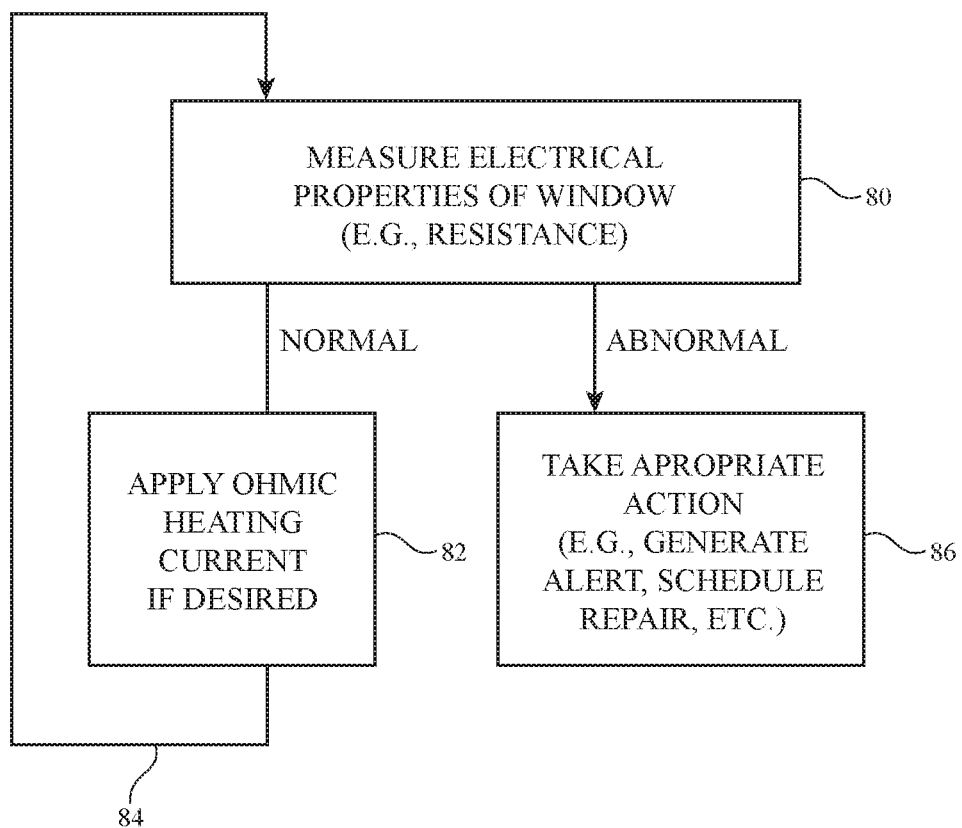
FIG. 11 is a flow chart of illustrative operations involved in using a window with crack detection and heating capabilities in accordance with an embodiment.

FIG. 11 is a flow chart of illustrative operations involved in using windows 16 in vehicle 10. Vehicle 10 may have a window 16 with one or more conductive layers and these layers may be used, for example, in forming infrared-light-blocking filters. Control circuitry 24 may be coupled to the conductive layers using one or more pairs of terminals 64. The terminals may be segmented as described in connection with FIG. 10 and/or may extend across the entire width and/or height of window 16 as described in connection with FIGS. 8 and 9.

To ensure that cracks in window 16 are detected, control circuitry 24 may measure the resistance of one or more conductive layers in window 16 during the operations of step 80. If desired, other electrical properties of window 16 may be measured (e.g., capacitance measurements may be made, inductance measurements may be made, etc.). The resistance measurements (or other electrical measurements) may be compared to threshold values (e.g., to determine whether measured resistance exceeds a predetermined threshold resistance), may be compared to moving averages and/or other historical resistance information, and/or may be processed using other techniques to determine whether or not the resistance of the conductive layer(s) is normal or is abnormal (i.e., abnormally high). If the electrical characteristics of the measured conductive layer are normal (e.g., the resistance for window 16 is normal), control circuitry 24 can conclude that there are no cracks present in window 16.

If the resistance of window 16 is normal and if a user or automatic process running on control circuitry 24 desires to ohmically heat some or all of window 16, control circuitry 24 can apply ohmic heating current to one or more selected portions of one or more conductive layers in layer(s) 54 of window 16 at step 82. If desired, ohmic heating can be localized by applying ohmic heating current using segmented terminals. Ohmic heating current may be applied through the same conductive layer that was monitored during the resistance measurements of step 80 or may be applied through one or more other conductive layers in window 16. If no heating of window 16 is needed, the operations of step 82 may be skipped. As indicated by line 84, processing may continually loop back through step 80, so that window 16 can be monitored for cracks. During crack detection operations, the application of ohmic heating current (if any) can be momentarily suspended or both crack-detection resistance measurements and ohmic current heating operations may be performed simultaneously.

As shown in FIG. 11, control circuitry 24 can take suitable action at step 86 in response to detection of an abnormal condition in window 16 (e.g., in response to detection of a crack by measuring an abnormally high resistance for a window conductive layer during the operations of step 80). As an example, ohmic heating operations can be suspended upon detecting a crack. A user may also be alerted to the presence of a crack by displaying a visual message on a display or presenting an audible alert or other alert to the user with one or more other input-output devices 22. If desired, alerts may be wirelessly transmitted to a portable electronic device or other electronic equipment associated with the user. For example, control circuitry 24 may send an email message or other message to a user that informs the user of the detected crack and advises the user to schedule a service appointment for vehicle 10. Vehicle 10 may also schedule the service appointment automatically without intervention by the user or following a brief confirmation from the user. Vehicle 10 may have autonomous driving capabilities. In this scenario, vehicle 10 may autonomously drive to a service facility for servicing (e.g., at night or other time when the user is not using vehicle 10). In some situations, the detected crack may be extensive, which indicates that window 16 is very damaged. Vehicle 10 may use an internal camera or other systems to confirm the extent of damage and/or may deactivate vehicle controls to prevent use of vehicle 10 until window 16 has been repaired. In the event that an unauthorized person breaks into vehicle 10, the automatic deactivation of vehicle 10 may prevent vehicle 10 from being stolen or used without authorization and this feature may therefore serve as a theft deterrent. Control circuitry 24 may also alert emergency services, send information to an insurance company, send information to a traffic management system, or send wireless messages to other parties in response to detection of a crack in window 16. Following satisfactory resolution of the operations of step 86, processing may loop back to step 80 so that additional resistance measurements may be made.

The foregoing is merely illustrative and various modifications can be made to the described embodiments. The foregoing embodiments may be implemented individually or in any combination.

What is claimed is:
1. A vehicle, comprising:
   a body;
   a vehicle window in the body having a blanket thin-film conductive layer and multiple terminals coupled to different respective locations of the blanket thin-film conductive layer; and
   control circuitry configured to:
      apply signals to the blanket thin-film conductive layer through the multiple terminals; and
      make electrical measurements on the blanket thin-film conductive layer.
2. The vehicle defined in claim 1 wherein the multiple terminals are distributed along first and second opposing sides of the blanket thin-film conductive layer.

3. The vehicle defined in claim 1 wherein the multiple terminals are distributed along first, second, third, and fourth sides of the blanket thin-film conductive layer.

4. The vehicle defined in claim 1 wherein the blanket thin-film conductive layer comprises an infrared-light-blocking layer.

5. The vehicle defined in claim 1 wherein the electrical measurements comprise resistance measurements.

6. The vehicle defined in claim 5 wherein the control circuitry is configured to detect a crack in the vehicle window based on the resistance measurements.

7. The vehicle defined in claim 6 wherein the control circuitry is configured to output an alert in response to detecting the crack in the vehicle window.

8. The vehicle defined in claim 6 wherein the control circuitry is configured to deactivate vehicle controls in response to detecting the crack in the vehicle window.

9. The vehicle defined in claim 1 wherein the control circuitry is configured to apply the signals to the blanket thin-film conductive layer to ohmically heat different regions of the blanket thin-film conductive layer by different amounts.

10. A vehicle, comprising:
a body;
a vehicle window in the body having a thin-film conductive layer and segmented terminals coupled to the thin-film conductive layer; and
control circuitry configured to:
apply a current to a first portion of the thin-film conductive layer though the segmented terminals; and
make electrical measurements on a second portion of the thin-film conductive layer.

11. The vehicle defined in claim 10 wherein the thin-film conductive layer comprises an infrared-light-blocking layer.

12. The vehicle defined in claim 10 wherein the electrical measurements comprise resistance measurements.

13. The vehicle defined in claim 12 wherein the control circuitry is configured to detect a crack in the vehicle window based on the resistance measurements.

14. The vehicle defined in claim 10 wherein the control circuitry is configured to apply the current to the first portion of the thin-film conductive layer to ohmically heat the first portion of the thin-film conductive layer.

15. A vehicle, comprising:
a body;
a vehicle window in the body having a conductive layer and terminals; and
control circuitry configured to:
apply a current to the conductive layer through the terminals; and
make electrical measurements on first and second different portions of the conductive layer.

16. The vehicle defined in claim 15 wherein the control circuitry is configured to apply the current to the conductive layer to ohmically heat the conductive layer.

17. The vehicle defined in claim 15 wherein the conductive layer forms part of a thin-film interference filter.

18. The vehicle defined in claim 15 wherein the control circuitry is configured to detect a window crack based on the electrical measurements.

19. The vehicle defined in claim 18 wherein the control circuitry is configured to deactivate vehicle controls in response to detecting the window crack.

* * * * *